United States Patent
Tseng et al.

(10) Patent No.: US 9,964,977 B2
(45) Date of Patent: May 8, 2018

(54) DEVICE AND METHOD FOR BODY-BIAS

(71) Applicant: TAIWAN SEMICONDUCTOR MANUFACTURING CO., LTD., Hsinchu (TW)

(72) Inventors: Chien-Chung Tseng, Hsinchu County (TW); Lipen Yuan, Hsinchu County (TW); Jhih-Jie Shao, Hsinchu (TW); Chien-Jung Li, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 14/929,062

(22) Filed: Oct. 30, 2015

(65) Prior Publication Data

US 2017/0123444 A1    May 4, 2017

(51) Int. Cl.
    *H03L 7/08*     (2006.01)
    *G05F 1/59*     (2006.01)
    *H03L 1/00*     (2006.01)

(52) U.S. Cl.
    CPC ............... *G05F 1/59* (2013.01); *H03L 1/00* (2013.01); *H03L 7/08* (2013.01); *H03L 7/0805* (2013.01)

(58) Field of Classification Search
    CPC .................... H03L 7/08; H03L 7/0814
    See application file for complete search history.

(56) References Cited

U.S. PATENT DOCUMENTS

| | | | | |
|---|---|---|---|---|
| 6,411,142 B1* | 6/2002 | Abbasi | ............... | H03L 7/0814 327/145 |
| 7,239,188 B1* | 7/2007 | Xu | ............... | H03L 7/0812 327/156 |
| 7,634,039 B2* | 12/2009 | Maneatis | ............... | H03L 7/07 375/376 |

OTHER PUBLICATIONS

Jing Yang et al., "Self Adaptive Body Biasing Scheme for Leakage Power Reduction in Nanoscale CMOS Circuit", GLSVLSI'12, May 3-4, 2012, Salt Lake City, Utah, USA.
Hassan Mostafa et al., "A Novel Low Area Overhead Direct Adaptive Body Bias (D-ABB) Circuit for Die-to-Die and Within-Die Variations Compensation", IEEE Transactions on Very Large Scale Integration (VLSI) Systems, vol. 19, No. 10, Oct. 2011.
P. B. Bacinschi et al., "An Analog On-Chip Adaptive Body Bias Calibration for Reducing Mismatches in Transistor Pairs", 978-3-9810801-3-1/DATE08 c 2008 EDAA. (2008).
James W. Tschanz et al., "Adaptive Body Bias for Reducing Impacts of Die-to-Die and Within-Die Parameter Variations on Microprocessor Frequency and Leakage," IEEE Journal of Solid-State Circuits, vol. 37, No. 11, Nov. 2002.

* cited by examiner

*Primary Examiner* — Hai L Nguyen
(74) *Attorney, Agent, or Firm* — Maschoff Brennan

(57) ABSTRACT

A device is disclosed that includes a delay circuit, a detection circuit, and a bias circuit. The delay circuit is configured to generate an oscillating signal in response to a reference signal, a first bias voltage, and a second bias voltage. The detection circuit is configured to compare the oscillating signal with the reference signal, to generate a detect signal. The bias circuit is configured to adjust the first bias voltage and the second bias voltage according to the detect signal and a reference voltage.

20 Claims, 5 Drawing Sheets

DEVICE AND METHOD FOR BODY-BIAS

BACKGROUND

With the increase of nanometer technology, performances of integrated circuits are severely affected with process variations. In some approaches, additional testing procedures are performed for per-die trimming. As such, the efficiency of the fabrication is reduced, and unnecessary expense is caused.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
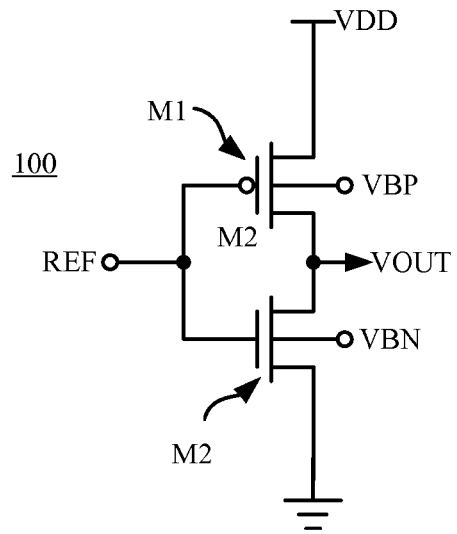
FIG. 1A is a schematic diagram of an inverter, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1B:
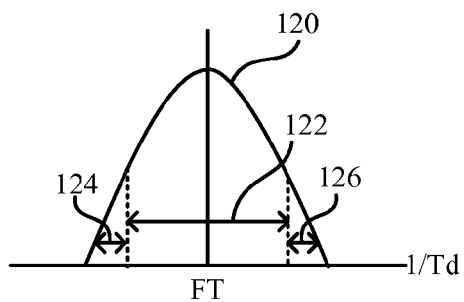
FIG. 1B is a curve of a process variation distribution corresponding to the inverter in FIG. 1A, in accordance with various embodiments of the present disclosure.

FIG. 1A is a schematic diagram of an inverter 100, in accordance with various embodiments of the present disclosure. FIG. 1B is a curve of a process variation distribution corresponding to the inverter 100 in FIG. 1A, in accordance with various embodiments of the present disclosure.

As illustratively shown in FIG. 1A, the inverter 100 includes switches M1 and M2. A first terminal of the switch M1 is configured to receive a voltage VDD, a second terminal of the switch M1 is configured to output an output signal VOUT, and a control terminal of the switch M1 is configured to receive a reference signal REF. A first terminal of the switch M2 is coupled to the second terminal of the switch M1, a second terminal of the switch M2 is coupled to ground, and a control terminal of the switch M2 is coupled to the control terminal of the switch M1. The switch M1 is configured to be turned on by the reference signal REF to pull the voltage level of the second terminal of the switch M1 to the voltage VDD. The switch M2 is configured to be turned on by the reference signal REF to pull the voltage level of the second terminal of the switch M1 to ground.

During the transition of the reference signal REF, for example, from a high voltage level to a low voltage level, the switch M2 is turned on, and the switch M1 is turned off. The output signal VOUT having a logic value of 0 is accordingly generated by the pulling down operation of the switch M2. Alternatively, during the transition of the reference signal REF, for example, from the low voltage level to the high voltage level, the switch M1 is turned on, and the switch M2 is turned off. The output signal VOUT having a logic value of 1 is accordingly generated by the pulling up operation of the switch M1.

As described above, the output signal VOUT is generated after the pulling-down operation of the switch M2 or the pulling-up operation of the switch M1 is performed. Effectively, a delay Td is introduced to the reference signal REF by the inverter 100, in order to generate the output signal VOUT. In various embodiments, the delay Td is varied with process variations.

For illustration, as shown in FIG. 1B, by measuring the output signals VOUT generated by sufficient number of the inverters 100, and utilizing the analysis of normal (Gaussian) distribution, the curve 120 of the process variation distribution corresponding to the inverter 100 is able to be obtained. According to the curve 120, the output signals VOUT generated by the majority of the inverters 100 have a target frequency FT, and the output signals VOUT generated by a minority of the inverters 100 have a frequency lower or higher than the target frequency FT. The inverters 100, corresponding to the target frequency FT, are distributed in a typical-typical (TT) process corner 122. The inverters 100, corresponding to the frequency lower than the target frequency FT, are distributed in a slow-slow (SS) process corner 124. The inverters 100, corresponding to the frequency higher than the target frequency FT, are distributed in a fast-fast (FF) process corner 126. If the number of the inverters 100 distributed in the SS process corner 124 and the FF process corner 126 is too large, effectively, the yield loss of the fabrication is increased.

With continued reference to FIG. 1A, in some embodiments, the switches M1 and M2 are implemented with various types of transistors. In further embodiments, the switches M1 and M2 are implemented with metal-oxide-semiconductor field-effect transistor (MOSFETs). For illustration, as shown in FIG. 1A, the switch M1 is implemented with a P-type MOSFET, and the switch M2 is implemented with an N-type MOSFET. The switch M1 is turned on when a voltage drop between the reference signal REF and the voltage VDD is higher than a threshold voltage of the switch M1. The switch M2 is turned on when a voltage drop between the reference signal REF and ground is higher than a threshold voltage of the switch M2. In some embodiments, the switch M1 further includes a bulk terminal configured to receive a bias voltage VBP, and the switch M2 further includes a bulk terminal configured to receive a bias voltage VBN. In some embodiments, the threshold voltage of the switch M1 is able to be adjusted by the bias voltage VBP. In some embodiments, the threshold voltage of the switch M2 is able to be adjusted by the bias voltage VBN.

Figure 1C:
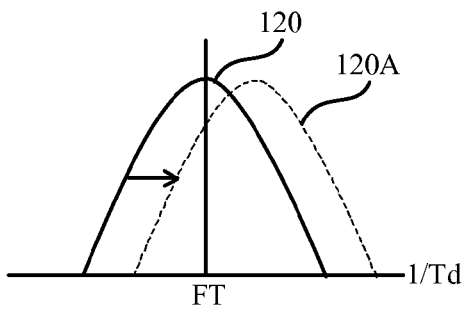
FIG. 1C is a curve of a process variation distribution corresponding to the inverter in FIG. 1A when the bias voltage in FIG. 1A increases, in accordance with various embodiments of the present disclosure.
Figure 1D:
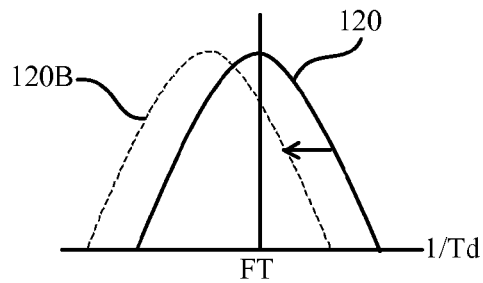
FIG. 1D is a curve of a process variation distribution corresponding to the inverter in FIG. 1A when the bias voltage in FIG. 1A decreases, in accordance with various embodiments of the present disclosure.

FIG. 1C is a curve of a process variation distribution corresponding to the inverter 100 in FIG. 1A when the bias voltage VBN increases, in accordance with various embodiments of the present disclosure. FIG. 1D is a curve of a process variation distribution corresponding to the inverter 100 in FIG. 1A when the bias voltage VBN decreases, in accordance with various embodiments of the present disclosure.

In some embodiments, when the bias voltage VBN is increased, the threshold voltage of the switch M2 is reduced. For illustration, compared with the curve 120 in FIG. 1B, in some embodiments illustrated in FIG. 1C, when the bias voltage is increased, the curve 120A of the process variation distribution is shifted toward to a higher frequency. In other words, the inverters 100 at SS process corner 124 in FIG. 1B are calibrated by applying the bias voltage VBN to generate the output signal VOUT having a higher frequency. As a result, the yield loss is effectively reduced. Alternatively, in some other embodiments, when the voltage VBN is decreased, the threshold voltage of the switch M2 is increased. For illustration, compared with the curve 120 in FIG. 1B, in some embodiments illustrated in FIG. 1D, the curve 120B of the process variation distribution is shifted toward to a lower frequency. In other words, the inverter 100 at the FF process corner 126 in FIG. 1B are calibrated by applying the bias voltage VBN to generate the output signal VOUT having a lower frequency. As a result, the yield loss is effectively reduced.

Corresponding to the bias voltage VBN, in some embodiments, when the bias voltage VBP is increased, the threshold voltage of the switch M1 is increased. Accordingly, the curve 120 of the process variation distribution is shifted toward to a lower frequency. Alternatively, in some other embodiments, when the voltage VBP is decreased, the threshold voltage of the switch M1 is decreased. Accordingly, the curve 120 of the process variation distribution is shifted toward to a higher frequency.

As far as an operational speed is concerned, in some approaches, the inverters 100 are overdesigned at least one boundary condition, for example, SS process corner 124, to ensure that even the inverters 100 at the SS process corner 124 are able to have the frequency equal to or higher than the target frequency FT. For example, the inverters 100 are designed at SS process corner with 0.9 times of the voltage VDD. However, when operating at lower supply voltage, for example, a near-threshold voltage or a sub-threshold voltage, the voltage headroom for the inverter 100 is too small. Accordingly, under such low supply voltage VDD, the operations of the inverters 100 would be failed. Thus, the inverters 100 are unable to be designed at SS process corner with 0.9 times of the voltage VDD. As a result, such approaches are failed.

In various embodiments, the bias voltage VBP and the bias voltage VPN are adjusted by measuring the variations on the inverter 100. Compared with the aforementioned approaches, with such arrangements, the variations between the inverters 100 are able to reduced, and the inverters 100 are able to have the frequency close to the target frequency FT. Detailed operations are described below with reference to FIG. 2 and FIG. 3.

Figure 2:
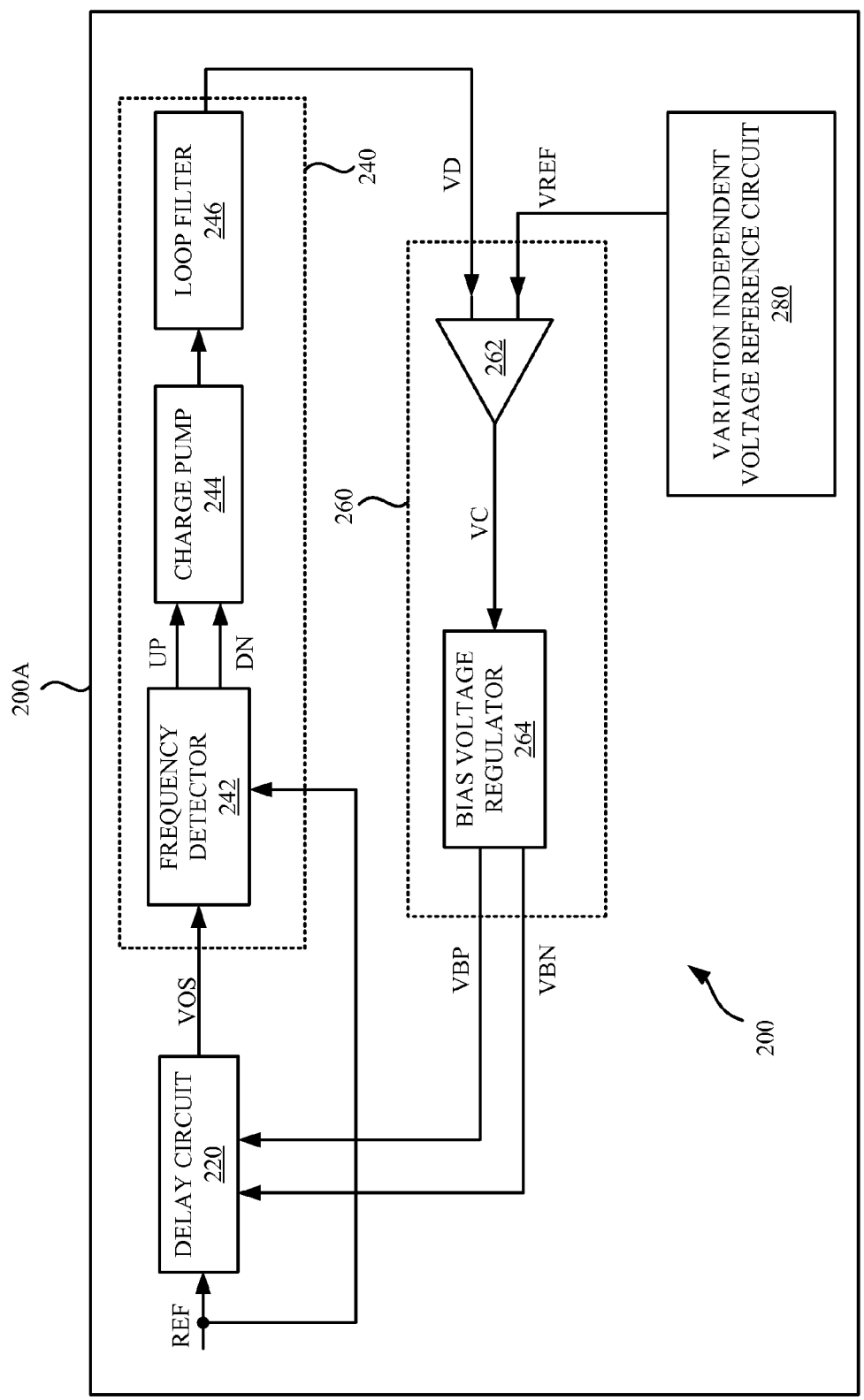
FIG. 2 is a schematic diagram of a device for adjusting the bias voltages in FIG. 1, in accordance with various embodiments of the present disclosure.

Reference is now made to FIG. 2. FIG. 2 is a schematic diagram of a device 200 for adjusting the bias voltages VBP and VBN in FIG. 1A, in accordance with various embodiments of the present disclosure.

As illustratively shown in FIG. 2, the device 200 includes a delay circuit 220, a detection circuit 240, and a bias circuit 260. The delay circuit 220 is configured to generate an oscillating signal VOS in response to a reference signal REF and the bias voltages VBP and VBN. In some embodiments, the delay circuit 220 includes the inverters 100, as illustrated in FIG. 1A, which are coupled in cascade. The cascaded inverters 100 are biased by the bias voltages VBP and VBN, as illustrated in FIG. 1A. In some embodiments, the cascaded inverters 100 together operate as a ring oscillator. The ring oscillator are configured to introduce a delay to the reference signal REF, in order to generate the oscillating signal VOS. In some embodiments, the delay is the sum of the delays introduced by twenty-one logic gates including, for example, the inverters 100 in FIG. 1A, NAND gates, NOR gate, selectors, etc. In some embodiments, the delays of the twenty-one of logic gates are sufficient to indicate a performance of common devices.

The number of logic gates, for introducing the delay, is given for illustrative purposes only. Various numbers of logic gates, for introducing the delay, are within the contemplated scope of the present disclosure.

In some embodiments, the device 200 is disposed in a chip 200A and is configured to adjust the bias voltages VBN and VBP for the MOSFETs, for example, MOSFETs M1 and M2 illustrated in FIG. 1A, in the chip 200A. In further embodiments, the delay introduced by the delay circuit 220 is configured to indicate a delay introduced by a critical path of the chip 200A. In some embodiments, the critical path is the path in the chip 200A between an input and an output with the maximum delay.

The arrangements of the delay circuit 220 are given for illustrative purposes. Various configurations of the delay circuit 220 are within the contemplated scope of the present disclosure.

The detection circuit 240 is configured to compare the oscillating signal VOS with the reference signal REF, to generate a detection signal VD. In some embodiments, the detection circuit 240 operates as a phase-locked loop of the device 200. For illustration, in some embodiments, the detection circuit 240 includes a frequency detector 242, a charge pump 244, and a loop filter 246. The frequency detector 242 is configured to compare a phase of the oscillating signal VOS with a phase of the reference signal REF, in order to generate an up signal UP and a down signal DN. The charge pump 244 is coupled to two output terminals of the frequency detector 242 to receive the up signal UP and the down signal DN. The charge pump 244 is configured to charge or discharge an output terminal of the charge pump 244 according to the up signal UP and the down signal DN.

The loop filter 246 is configured to generate the detect signal VD in response to the voltage level of the output terminal of the charge pump 244. In some embodiments, the loop filter 246 filters the noises on the output terminal of the charge pump 244, and rectifies the voltage level of the output terminal of the charge pump 244 to generate the detect signal VD.

Furthermore, the bias circuit 260 is coupled to an output terminal of the loop filter 246 to receive the detect signal VD. The bias circuit 260 is configured to adjust the bias voltages VBP and VBN according to the detect signal VD and a reference voltage VREF. In some embodiments, the bias circuit 260 includes a comparator 262 and a bias voltage regulator 264. The comparator 262 is configured to compare the detect signal VD with the reference voltage VREF, in order to generate a control signal VC. The bias voltage regulator 264 is configured to adjust the bias voltages VBP and VBN according to the control signal VC.

In some embodiments, as shown in FIG. 2, the device 200 further includes a variation independent voltage reference circuit 280. The variation independent voltage reference circuit 280 is configured to be immune to process, voltage, and temperature (PVT) variations. With such immunity, the variation independent voltage reference circuit 280 is able to generate the reference voltage VREF having a fixed voltage level under the PVT variations. In other words, by utilizing the variation independent voltage reference circuit 280, a fixed voltage, i.e., the reference voltage VREF, sufficient to indicate the inverters 100 at the TT process corner is generated, in order to be compared with the detect signal VD. In some embodiments, the variation independent voltage reference circuit 280 is implemented with a bandgap voltage reference circuit.

The arrangements of the device 200 in FIG. 2 are given for illustrative purposes. Various arrangements of the device 200 in FIG. 2 are within the contemplated scope of the present disclosure.

Figure 3:
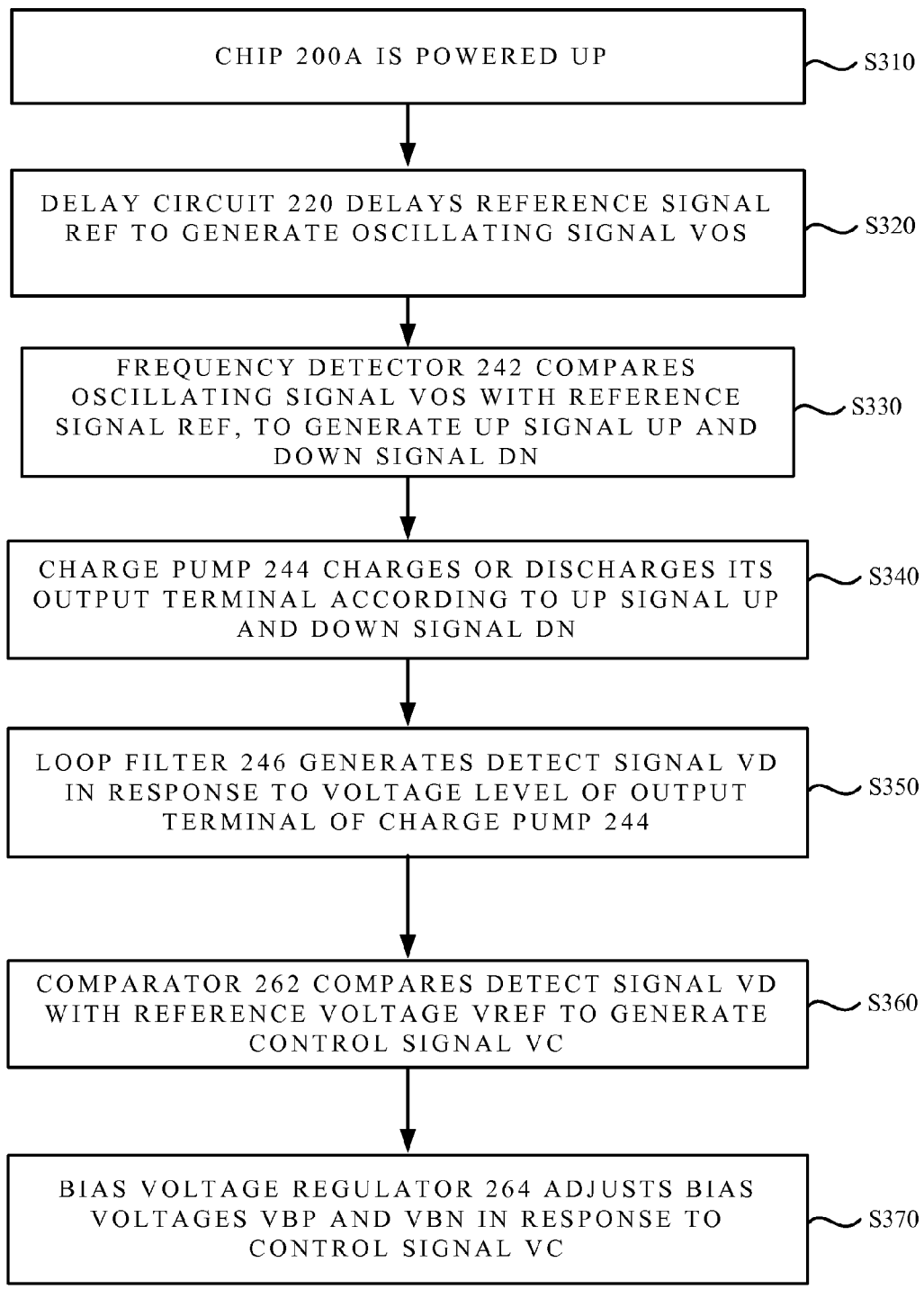
FIG. 3 is a flow chart of a calibration method, in accordance with various embodiments of the present disclosure.

FIG. 3 is a flow chart of a calibration method 300, in accordance with various embodiments of the present disclosure. The calibration method 300 is described below with reference to FIG. 2. In some embodiments, the calibration method 300 includes operations S310-S370.

In operation S310, the chip 200A is powered up. In operation S320, the delay circuit 220 delays the reference signal REF to generate the oscillating signal VOS. In operation S330, the frequency detector 242 compares the oscillating signal VOS with the reference signal REF, to generate the up signal UP and the down signal DN. Accordingly, the variations on the chip 200A are determined. In operation S340, the charge pump 244 charges or discharges its output terminal according to the up signal UP and the down signal DN. For illustration, when the frequency detector 242 determines that the phase of the oscillating signal VOS leads the phase of the reference REF, the frequency detector 242 then outputs the up signal UP having a logic value of 1 and the down signal DN having a logic value of 0. The charge pump 244 thus charges its output terminal. As a result, the voltage level of the output terminal of the charge pump 244 is increased. Alternatively, when the frequency detector 242 determines that the phase of the oscillating signal VOS lags behind the phase of the reference REF, the frequency detector 242 then outputs the up signal UP having the logic value of 0 and the down signal DN having the logic value of 1. The charge pump 244 thus discharges its output terminal. As a result, the voltage level of the output terminal of the charge pump 244 is decreased.

With continued reference to FIG. 3, in operation S350, the loop filter 246 generates the detect signal VD in response to the voltage level of the output terminal of the charge pump 244. In operation S360, the comparator 262 compares the detect signal VD with the reference voltage VREF to generate the control signal VC. In operation S370, the bias voltage regulator 264 adjusts the bias voltages VBP and VBN in response to the control signal VC, in which the bias voltages VBP and VBN are configured to bias the bulk terminals of MOSFETs, for example, the switches M1 and M2 illustrated in FIG. 1A, in the chip 200A.

For illustration, when the detect signal VD is higher than the reference voltage VREF, the comparator 262 outputs the control signal VC has the logic value of 1. Accordingly, the bias voltage regulator 264 increases the bias voltage VBN, and decreases the bias voltage VBP. Alternatively, when the detect signal VD is lower than the reference voltage VREF, the comparator 262 outputs the control signal VC has the logic value of 0. Accordingly, the bias voltage regulator 264 decreases the bias voltage VBN, and increases the bias voltage VBP. Effectively, the impact on the performance, for example, speed, of the chip 200A from the variations is reduced.

In some embodiments, the operations S310-S370 are described with the embodiments of the device 200 disposed in the chip 200A. In such embodiments, the device 200 self-calibrates the bias voltages VBN and VBP whenever the chip 200A is powered up. With the operations S310-S370, a die-to-die tuning is achieved without extra testing procedure. Compared with the approaches discussed above, the corner variation with a low voltage operation is effectively minimized.

In some situations, if the intrinsic body diode of the switch M1 is turned on by the bias voltage VBP and/or the intrinsic body diode of the switch M2 is turned on by the bias voltage VBN during the calibration processes as discussed above in FIG. 3, the leakage current of the MOSFETs in the chip thus increases. The leakage current of the chip 200A increases accordingly. As a result, the power consumption of the chip 200A is increased, and the reliability of the chip 200A is reduced. In order to prevent the issues above, in some further embodiments of the present disclosure, the bias voltage regulator 264 stops adjusting the bias voltages VBP and the bias VBN when the adjusted bias voltage VBP is lower than a conduction voltage of the intrinsic body diode of the switch M1 in FIG. 1A, or when the adjusted bias voltage VBN is higher than the a conduction voltage of the intrinsic body diode of the switch M2 in FIG. 1A.

For illustration, in the embodiments above, the bias voltage regulator 264 further compares the adjusted bias voltage VBP with the conduction voltage of the intrinsic body diode of the switch M1, and compares the adjusted bias voltage VBN with the conduction voltage of the intrinsic body diode of the switch M2, before outputting the adjusted bias voltages VBP and VBN to the MOSFETs in the chip 200A. Accordingly, the conduction of the intrinsic body diodes of the switches in the chip 200A is able to be prevented. As a result, the reliability of the chip 200A is improved.

As discussed above, if the bias voltage VBP for the bulk terminal of the P-type MOSFET, for example, the switch M1 in FIG. 1A, decreases, the threshold voltage of the P-type MOSFET is reduced. Similarly, if the bias voltage VBN for the bulk terminal of the N-type MOSFET, for example, the switch M2 in FIG. 1A, increases, the threshold voltage of the N-type MOSFET is reduced. In some conditions, if the threshold voltage of the P-type MOSFET and/or the threshold voltage of the N-type MOSFET are too low, the leakage currents from the P-type MOSFET and the N-type MOSFET are increased. Thus, the power consumption of the chip 200A is increased, and the reliability of the chip 200A is reduced. In order to prevent the issues above, in some further embodiments of the present disclosure, the bias voltage regulator 264 stops adjusting the bias voltages VBP and the bias VBN when the adjusted bias voltage VBP is lower than a predetermined voltage, corresponding to a maximum leakage current of the switch M1 in FIG. 1A, or when the adjusted bias voltage VBN is higher than a predetermined voltage, corresponding to a leakage current of the switch M2 in FIG. 1A, before outputting the adjusted bias voltages VBP and VBN to the switches in the chip 200A.

For illustration, the bias voltage regulator 264 further compares the adjusted bias voltage VBP with the predetermined voltage that is defined according to the requirements for a maximum leakage current of the switch M1, and compares the adjusted bias voltage VBN with the predetermined voltage that is defined according to the requirements for a maximum leakage current of the switch M2, before outputting the adjusted bias voltages VBP and VBN to the switches in the chip 200A. Accordingly, the leakage current of the MOSFETs in the chip 200A is able to be reduced. As a result, the reliability of the chip 200A is improved.

In some embodiments, the bias voltage regulator 264 is implemented with digital circuits. In further embodiments, the digital circuits include a digital control circuit, a digital-to-analog converter, etc.

The arrangements of the bias voltage regulator 264 are given for illustrative purposes. Various arrangements of the bias voltage regulator 264 are within the contemplated scope of the present disclosure.

Figure 4:
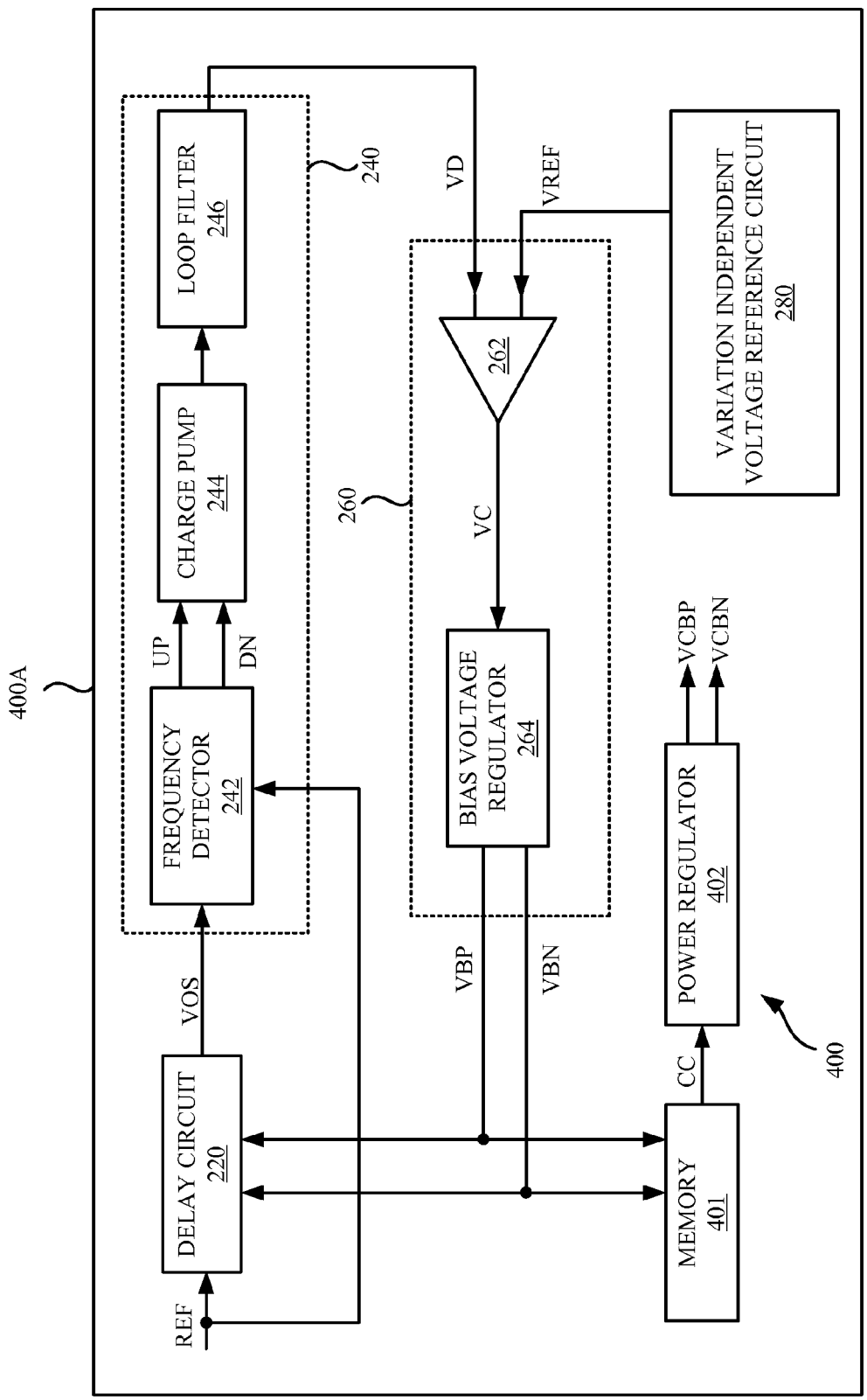
FIG. 4 is a schematic diagram of a device for adjusting the bias voltages in FIG. 1A, in accordance with various embodiments of the present disclosure.

Reference is now made to FIG. 4. FIG. 4 is a schematic diagram of a device 400 for adjusting the bias voltages VBP and VBN in FIG. 1A, in accordance with various embodiments of the present disclosure.

Compared with the device 200 in FIG. 2, in some embodiments illustrated in FIG. 4, the device 400 further includes a memory 401 and a power regulator 402. The memory 401 is coupled to the bias voltage regulator 264 to receive the adjusted bias voltages VBP and VBN. The memory 401 is configured to generate a control code CC according to the adjusted bias voltages VBP and VBN. In some embodiments, the memory 401 stores a look-up table (not shown) having the information of the control code CC. The specific control code CC is able to be determined according to the adjusted bias voltages VBP and VBN through the loop-up table.

The power regulator 402 is coupled to the memory 401 to receive the control code CC. The power regulator 402 is configured to generate calibrated bias voltages VCBP and VCBN according to the control code CC. The calibrated bias voltage VCBP is configured to be applied to the bulk terminals of P-type transistors, for example, the switch M1 in FIG. 1A, in the chip 400A. The calibrated bias voltage VCBN is configured to be applied to the bulk terminals of N-type transistors, for example, the switch M2 in FIG. 1A, in the chip 400A. In some embodiments, the calibrated bias voltage VCBP is linearly correlated to the bias voltage VBP, and the calibrated bias voltage VCBN is linearly correlated to the bias voltage VBN. In further embodiments, the calibrated bias voltage VCBP is equal to the bias voltage VBP, and the calibrated bias voltage VCBN is equal to the bias voltage VBN.

For illustration, when the logic values of the control code CC is "11", the power regulator 402 then increases the calibrated bias voltage VCBN and decreases the calibrated bias voltage VCBP, such that the process corners of the chip 400A shift towards to the higher frequency 1/Td, as illustrated in FIG. 1C. Alternatively, when the logic values of the control code CC is "00", the power regulator 402 then decreases the calibrated bias voltage VCBN and increases the calibrated bias voltage VCBP, such that the process corners of the chip 400A shift towards to the lower frequency 1/Td, as illustrated in FIG. 1D.

The configurations of the power regulator 402 in FIG. 4 are given for illustrative purposes. Various configurations of the power regulator 402 in FIG. 4 are within the contemplated scope of the present disclosure.

In some embodiments illustrated in FIG. 4, all of the components of the device 400 are disposed in the chip 400A. In some embodiments, the memory 401 is a non-volatile memory. In further embodiments, the non-volatile memory includes an eFuse, an electrically-erasable programmable read-only memory (EEPROM), a flash memory, or a magneto resistive random-access memory (MRAM). In such embodiments, the adjusted bias voltage VBN and VBP are generated and stored in the memory 401 in a digital form, when the device 400 in FIG. 4 is powered up for the first time. Accordingly, the calibrated bias voltages VCBN and VCBP are also determined when the device 400 in FIG. 4 is powered up for the first time. After the calibrated bias voltages VCBN and VCBP are determined, the calibration of the device 400 in FIG. 4 is ended. In other words, compared with the operations illustrated in FIG. 3, the operations of the device 400 in FIG. 4 is one-time self-calibration.

The arrangements of the device 400 in FIG. 4 are given for illustrative purposes. Various arrangements of the device 400 in FIG. 4 are within the contemplated scope of the present disclosure.

Figure 5:
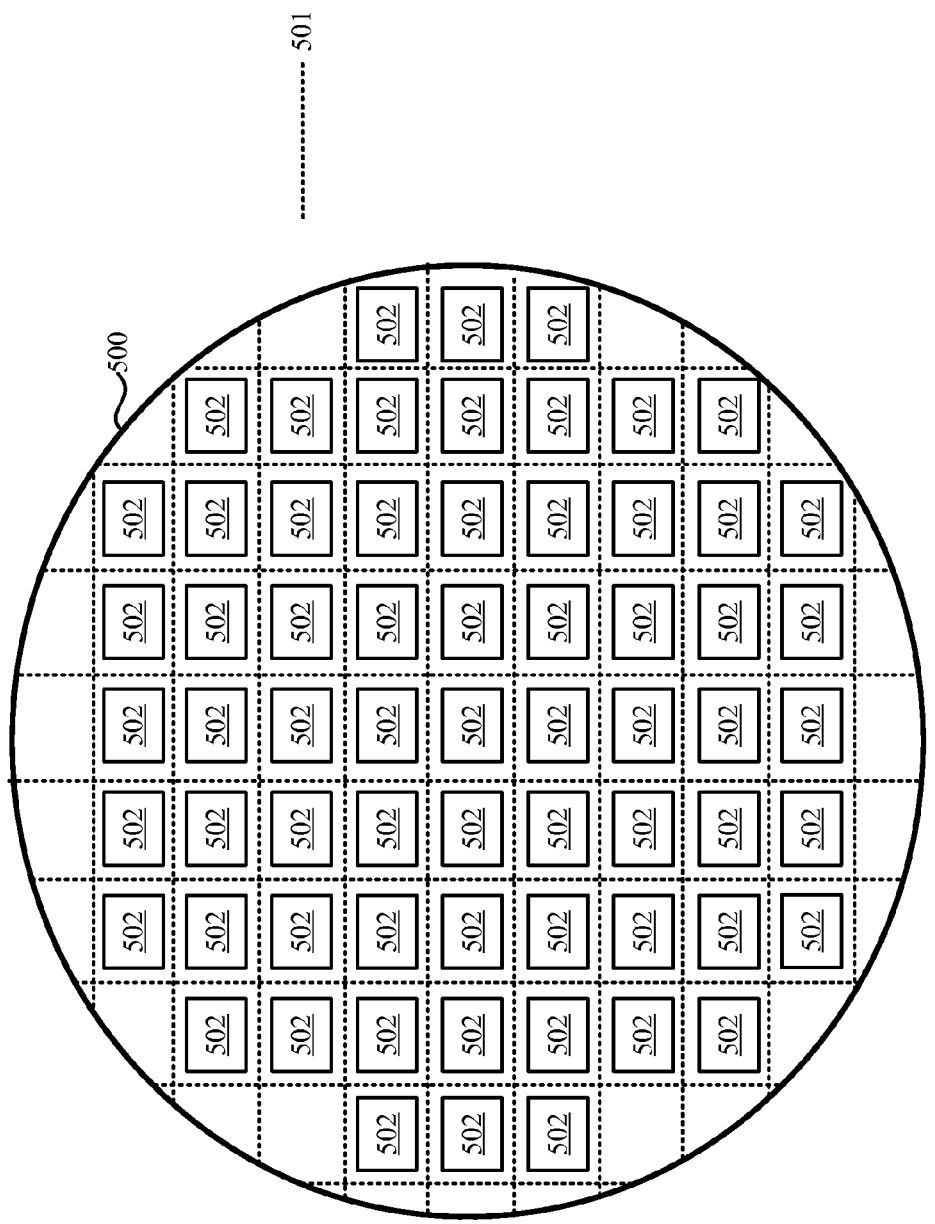
FIG. 5 is a schematic diagram of a wafer containing the device in FIG. 4, in accordance with various embodiments of the present disclosure.

FIG. 5 is a schematic diagram of a wafer 500 containing the device 200 in FIG. 4, in accordance with various embodiments of the present disclosure.

As shown in FIG. 5, a wafer 500 includes testing lines 501 and dies 502. The testing lines 501 are configured to separate the dies 502 from each other. Each of the dies 502 includes one or more chips. In some other embodiments, with reference to both of FIGS. 4-5, the memory 401 in FIG. 4 and the power regulator 402 are in FIG. 4 disposed in the dies 502. The delay circuit 210, the detection circuit 220, the bias circuit 240, and the variation independent voltage reference circuit 280 are disposed on one of the testing lines 501 of the wafer 500. With such arrangements, the one-time self-calibration is performed during the testing procedure of the wafer 500 before dicing the wafer 500. Accordingly, a wafer-level variation between the chips on the wafer 500 is minimized. As a result, the yield loss is reduced.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes a delay circuit, a detection circuit, and a bias circuit. The delay circuit is configured to generate an oscillating signal in response to a reference signal, a first bias voltage, and a second bias voltage. The detection circuit is configured to compare the oscillating signal with the reference signal, to generate a detect signal. The bias circuit is configured to adjust the first bias voltage and the second bias voltage according to the detect signal and a reference voltage.

Also disclosed is a device that includes a delay circuit and a bias circuit. The delay circuit includes at least one inverter, and is configured to introduce a delay to a reference signal through the inverter to generate an oscillating signal, and the delay is adjusted according to a first bias voltage and a second bias voltage. The bias circuit is configured to adjust the first bias voltage and the second bias voltage according to a difference between the reference signal and the oscillating signal.

Also disclosed is a method that includes the operation below. An oscillating signal is generated by a delay circuit according to a reference signal, a first bias voltage and a second bias voltage. The oscillating signal is compared by a detection circuit with the with the reference signal to generate a detect signal. The first bias voltage and the second bias voltage are adjusted by a bias circuit according to the detect signal and a reference voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a delay circuit configured to generate an oscillating signal in response to a reference signal, a first bias voltage, and a second bias voltage;
   a detection circuit, comprising a frequency detector configured to compare the oscillating signal with the reference signal, in order to generate a detect signal; and
   a bias circuit configured to adjust the first bias voltage and the second bias voltage according to the detect signal and a reference voltage,
   wherein the delay circuit comprises a first-type transistor and a second-type transistor that are configured to introduce a delay to the reference signal to generate the oscillating signal, a bulk terminal of the first-type transistor is configured to receive the first bias voltage, and a bulk terminal of the second-type transistor is configured to receive the second bias voltage.

2. The device of claim 1, wherein the delay circuit comprises a plurality of inverters coupled in cascade and the plurality of inverters are configured to introduce the delay to the reference signal, the first-type transistor and the second-type transistor are configured to operate as one of the plurality of inverters, and wherein the first-type transistor is an N-type transistor, and the second-type transistor is a P-type transistor coupled to the N-type transistor in cascade.

3. The device of claim 2, wherein the bias circuit comprises:
   a comparator configured to generate a control signal in response to the detect signal and the reference voltage; and
   a bias voltage regulator configured to adjust the first bias voltage and the second bias voltage in response to the control signal.

4. The device of claim 3, wherein the bias voltage regulator is further configured to stop adjusting the first bias voltage and the second bias voltage when the adjusted first bias voltage is higher than a conduction voltage of an intrinsic body diode of the N-type transistor, or when the adjusted second bias voltage is lower than a conduction voltage of an intrinsic body diode of the P-type transistor.

5. The device of claim 3, wherein the bias voltage regulator is further configured to stop adjusting the first bias voltage and the second bias voltage when the adjusted first bias voltage is higher than a first predetermined voltage, or when the adjusted second bias voltage is lower than a second predetermined voltage, and
   wherein the first predetermined voltage is defined according to a maximum leakage current of the N-type transistor, and the second predetermined voltage is defined according to a maximum leakage current of the P-type transistor.

6. The device of claim 1, wherein the delay is configured to indicate a delay introduced by a critical path of a chip.

7. The device of claim 1, wherein the delay circuit, detection circuit, and the bias circuit are disposed on a chip or a wafer, the first bias voltage is configured to be applied to a bulk terminal of an N-type transistor in the chip, and the second bias voltage is configured to be applied to a bulk terminal of a P-type transistor in the chip.

8. The device of claim 7, further comprising:
   a memory configured to store the first bias voltage and the second bias voltage adjusted by the bias circuit, and generate a control code; and
   a power regulator configured to generate a first calibrated bias voltage for the N-type transistor in the chip and a second calibrated bias voltage for the P-type transistor in the chip according to the control code.

9. The device of claim 8, wherein the memory and the power regulator are disposed on the chip, the delay circuit, and the detection circuit, the bias circuit are disposed on a testing line of the wafer, and the chip is disposed on the wafer.

10. The device of claim 1, wherein the frequency detector is configured to compare the oscillating signal with the reference signal to generate an up signal and a down signal, and the detection circuit further comprises:
    a charge pump configured to charge or discharge an output terminal of the charge pump according to the up signal and the down signal; and
    a loop filter configured to generate the detect signal in response to a voltage level of the output terminal of the charge pump.

11. The device of claim 1, further comprising:
    a variation independent voltage reference circuit configured to generate the reference voltage.

12. A device comprising:
    a delay circuit comprising at least one inverter, and configured to introduce a delay to a reference signal through the at least one inverter to generate an oscillating signal, and the delay being adjusted according to a first bias voltage and a second bias voltage; and
    a bias circuit configured to adjust the first bias voltage and the second bias voltage according to a difference between the reference signal and the oscillating signal,
    wherein the at least one inverter comprises a first-type transistor and a second-type transistor, a bulk terminal of the first-type transistor is configured to receive the first bias voltage, and a bulk terminal of the second-type transistor is configured to receive the second bias voltage.

13. The device of claim 12, further comprising:
a frequency detector configured to generate an up signal and a down signal according to the difference between the reference signal and the oscillating signal;
a charge pump configured to charge or discharge an output terminal of the charge pump according to the up signal and the down signal; and
a loop filter configured to generate a detect signal in response to a voltage level of the output terminal of the charge pump.

14. The device of claim 13, wherein the bias circuit comprises:
a comparator configured to generate a control signal in response to the detect signal and a reference voltage; and
a bias voltage regulator configured to adjust the first bias voltage and the second bias voltage in response to the control signal.

15. The device of claim 12, wherein the delay is configured to indicate a delay introduced by a critical path of a chip.

16. A method comprising:
generating an oscillating signal, by a delay circuit, according to a reference signal, a first bias voltage, and a second bias voltage,
wherein a delay is introduced, by a first-type transistor and a second-type transistor in the delay circuit, to the reference signal to generate the oscillating signal, a bulk terminal of the first-type transistor is configured to receive the first bias voltage, and a bulk terminal of the second-type transistor is configured to receive the second bias voltage;
comparing the oscillating signal with the reference signal, by a frequency detector of a detection circuit, to adjust a voltage level of a node of the detection circuit, in order to generate a detect signal in response to the voltage level of the node; and
adjusting the first bias voltage and the second bias voltage, by a bias circuit, according to the detect signal and a reference voltage.

17. The method of claim 16, wherein the first-type transistor is a P-type transistor, the second-type transistor is an N-type transistor, the P-type transistor and the N-type transistor are configured to operate as an inverter for introducing the delay, and the delay is adjusted by the first bias voltage and the second bias voltage and is configured to indicate a delay introduced by a critical path of a chip.

18. The method of claim 16, wherein the comparing the oscillating signal comprises:
comparing the oscillating signal with the reference signal, by the frequency detector of the detection circuit, to generate an up signal and a down signal;
charging or discharging an output terminal of a charge pump of the detection circuit according to the up signal and the down signal, wherein the output terminal of the charge pump corresponds to the node of the detection circuit; and
generating the detect signal, by a loop filter of the detection circuit, in response to a voltage level of the output terminal of the charge pump.

19. The method of claim 16, wherein the adjusting the first bias voltage and the second bias voltage comprises:
generating a control signal, by a comparator of the bias circuit, in response to the detect signal and the reference voltage; and
adjusting the first bias voltage and the second bias voltage, by a bias voltage regulator of the bias circuit, in response to the control signal.

20. The method of claim 19, further comprising:
storing the first bias voltage and the second bias voltage adjusted by the bias voltage regulator to a memory;
generating a control code, by the memory, according to the adjusted first bias voltage and the second bias voltage; and
generating a first calibrated bias voltage and a second calibrated bias voltage, by a power regulator, to bulk terminals of transistors in a chip according to the control code.

* * * * *